United States Patent
Liu et al.

(10) Patent No.: US 9,893,220 B2
(45) Date of Patent: Feb. 13, 2018

(54) CIGS NANOPARTICLE INK FORMULATION HAVING A HIGH CRACK-FREE LIMIT

(71) Applicant: Nanoco Technologies Ltd., Manchester (GB)

(72) Inventors: Zugang Liu, Manchester (GB); Christopher Newman, West Yorkshire (GB)

(73) Assignee: Nanoco Technologies Ltd., Manchester (GB)

(*) Notice: Subject to any disclaimer, the term of this patent is extended or adjusted under 35 U.S.C. 154(b) by 0 days.

(21) Appl. No.: 14/513,001

(22) Filed: Oct. 13, 2014

(65) Prior Publication Data
US 2015/0101665 A1    Apr. 16, 2015

Related U.S. Application Data

(60) Provisional application No. 61/891,166, filed on Oct. 15, 2013.

(51) Int. Cl.
    *H01L 21/00* (2006.01)
    *H01L 31/00* (2006.01)
    (Continued)

(52) U.S. Cl.
    CPC ......... *H01L 31/0322* (2013.01); *C09D 11/52* (2013.01); *Y02E 10/541* (2013.01)

(58) Field of Classification Search
    CPC ............. H01L 31/0248; H01L 31/0256; H01L 31/0264; H01L 31/0272; H01L 31/032;
    (Continued)

(56) References Cited

U.S. PATENT DOCUMENTS

| | | | |
|---|---|---|---|
| 8,784,701 B2 | 7/2014 | Pickett et al. | |
| 2007/0151862 A1* | 7/2007 | Dobson | C25D 3/58 205/220 |

(Continued)

FOREIGN PATENT DOCUMENTS

| | | |
|---|---|---|
| EP | 2520621 A1 | 11/2012 |
| KR | 20110107673 B1 | 10/2011 |

(Continued)

OTHER PUBLICATIONS

Author Unknown, Toluene, "Sigma-Aldrich Solvent Center" accessed at http://www.sigmaaldrich.com/chemistry/solvents/toluene-center.printerview.html on Jan. 14, 2016.*

(Continued)

*Primary Examiner* — Eli Mekhlin
(74) *Attorney, Agent, or Firm* — Blank Rome, LLP

(57) ABSTRACT

A method for formulating a CIGS nanoparticle-based ink, which can be processed to form a thin film with a crack-free limit (CFL) of 500 nm or greater, comprises: dissolving or dispersing $Cu(In,Ga)S_2$ and $Cu(In,Ga)Se_2$ nanoparticles; mixing the nanoparticle solutions/dispersions and adding oleic acid to form an ink; depositing the ink on a substrate; annealing to remove the organic components of the ink formulation; forming a film with a CFL $\geq 500$ nm; and, repeating the deposition and annealing process to form a CIGS film having a thickness $\geq 1$ μm. The film so produced may be incorporated into a thin film photovoltaic device.

21 Claims, 2 Drawing Sheets

(51) Int. Cl.
*H01L 31/032* (2006.01)
*C09D 11/52* (2014.01)

(58) Field of Classification Search
CPC ............. H01L 31/0322; H01L 31/0323; H01L 31/0336; H01L 31/0352; H01L 31/0749; H01L 31/18; C09D 11/52
See application file for complete search history.

(56) References Cited

U.S. PATENT DOCUMENTS

| | | | |
|---|---|---|---|
| 2008/0257201 | A1 | 10/2008 | Harris et al. |
| 2009/0139574 | A1* | 6/2009 | Pickett .................. B82Y 30/00 136/265 |
| 2010/0044676 | A1 | 2/2010 | Sargent et al. |
| 2010/0116678 | A1* | 5/2010 | Wang ....................... C25D 3/54 205/261 |
| 2010/0154872 | A1 | 6/2010 | Jun et al. |
| 2011/0056564 | A1 | 3/2011 | Korgel et al. |
| 2011/0065228 | A1 | 3/2011 | Li |
| 2011/0067755 | A1* | 3/2011 | Hakuma ............... C23C 14/185 136/256 |
| 2011/0067997 | A1* | 3/2011 | Nguyen .............. C23C 14/0623 204/192.25 |
| 2011/0294254 | A1* | 12/2011 | Jackrel ............... H01L 31/0322 438/95 |
| 2012/0017985 | A1* | 1/2012 | Rode ....................... C08G 77/62 136/256 |
| 2012/0100661 | A1* | 4/2012 | Choe ................ H01L 21/02422 438/63 |
| 2012/0115312 | A1* | 5/2012 | Agrawal ................ B82Y 30/00 438/478 |
| 2012/0122268 | A1 | 5/2012 | Agrawal et al. |
| 2012/0138866 | A1* | 6/2012 | Agrawal ............... C23C 18/127 252/501.1 |
| 2012/0227811 | A1* | 9/2012 | Lau ....................... C04B 35/547 136/262 |
| 2014/0048137 | A1* | 2/2014 | Cao ....................... C09D 11/52 136/264 |
| 2014/0249324 | A1 | 9/2014 | Harris et al. |

FOREIGN PATENT DOCUMENTS

| | | |
|---|---|---|
| KR | 20120085331 A | 6/2012 |
| TW | 201116558 A | 5/2011 |
| WO | 2010062708 A2 | 6/2010 |
| WO | 2012075267 A1 | 6/2012 |

OTHER PUBLICATIONS

Author Unknown, Dodecane, "Sigma-Aldrich" accessed at http://www.sigmaaldrich.com/catalog/product/sial/297879?lang=en&region=US# on Jan. 14, 2016.*

Author Unknown, Oleic Acid, "Sigma-Aldrich" accessed at http://www.sigmaaldrich.com/catalog/product/sial/o1008?lang=en&region=US# on Jan. 14, 2016.*

Panthani et al., J. Am. Chem. Soc. 2008, 130, 16770-16777.*

Matthew G Panthani et al: "Synthesis of $CuInS_2$, $CuInSe_2$, and $Cu(In_xGa_{1-x})Se_2$(CIGS) Nanocrystal "Inks" for Printable Photovoltaics", Journal of the American Chemical Society, American Chemical Society, vol. 130, No. 49, Dec. 10, 2008 (Dec. 10, 2008), pp. 16770-16777, XP008151951, ISSN: 0002-7863, DOI: 10.1021/JA805845Q [retrieved on Nov. 17, 2008] the whole document.

Guo, Q. et al., "Sulfide Nanocrystals Inks for Dense $Cu(In_{1-x}Ga_x)(S_{1-y}Se_y)_2$ Absorber Films and Their Photovoltaic Performance", Nano Letters, (2009), vol. 9, No. 8, pp. 3060-3065.

Willis, A.W. et al., "Thermally Degradable Ligands for Nanocrystals", American Chemical Society Nano, (2010), vol. 4, No. 8, pp. 4523-4530.

Oda, Y. et al., "Electrodeposition of Crack-Free $CuGaSe_2$ Thin Films from Single Bath", J. Electrochem. Soc., (2008), 155, H292.

Todorov, T. et al., "Direct Liquid Coating of Chalcopyrite Light-Absorbing Layers for Photovoltaic Devices", Eur. J. Inorg. Chem., (2010), 1, 17.

* cited by examiner

CIGS NANOPARTICLE INK FORMULATION HAVING A HIGH CRACK-FREE LIMIT

CROSS-REFERENCE TO RELATED APPLICATIONS

This application claims the benefit of U.S. Provisional Application No. 61/891,166 filed on Oct. 15, 2013.

STATEMENT REGARDING FEDERALLY SPONSORED RESEARCH OR DEVELOPMENT

Not Applicable

BACKGROUND OF THE INVENTION

1. Field of the Invention

The present invention generally relates to thin film photovoltaic devices. More particularly, it relates to copper indium gallium diselenide/disulfide—(CIGS)-based thin film photovoltaic devices.

2. Description of the Related Art including information disclosed under 37 CFR 1.97 and 1.98

In order to be commercially viable, photovoltaic (PV) cells must generate electricity at a competitive cost to fossil fuels. To meet these costs, the PV cells must comprise low cost materials along with an inexpensive device fabrication process and with moderate to high conversion efficiency of sunlight to electricity. In order for a device-building method to succeed, the materials synthesis and device fabrication must be commercially scalable.

At present, the photovoltaic market is still dominated by silicon wafer-based solar cells (first-generation solar cells). However the active layer in these solar cells comprises silicon wafers having a thickness ranging from microns to hundreds of microns because silicon is a relatively poor absorber of light. These single-crystal wafers are very expensive to produce because the process involves fabricating and slicing high-purity, single-crystal silicon ingots, and is also very wasteful.

The high cost of crystalline silicon wafers has led the industry to look at cheaper materials to make solar cells and, for this reason, much development work has focused on producing high efficiency thin film solar cells where material costs are significantly reduced compared to silicon.

Semiconductor materials like copper indium gallium diselenides and sulfides ($Cu(In,Ga)(S,Se)_2$, herein referred to as "CIGS") are strong light absorbers and have band gaps that match well with the optimal spectral range for PV applications. Furthermore, because these materials have strong absorption coefficients the active layer in the solar cell need be only a few microns thick.

Copper indium diselenide ($CuInSe_2$) is one of the most promising candidates for thin film PV applications due to its unique structural and electrical properties. Its band gap of 1.0 eV is well-matched with the solar spectrum. $CuInSe_2$ solar cells can be made by selenization of $CuInS_2$ films because, during the selenization process, Se replaces S and the substitution creates volume expansion, which reduces void space and reproducibly leads to a high quality, dense $CuInSe_2$ absorber layers. [Q. Guo, G. M. Ford, H. W. Hillhouse and R. Agrawal, Nano Lett., 2009, 9, 3060] Assuming complete replacement of S with Se, the resulting lattice volume expansion is approximately 14.6%, which is calculated based on the lattice parameters of chalcopyrite (tetragonal) $CuInS_2$ (a=5.52 Å, c=11.12 Å) and $CuInSe_2$ (a=5.78 Å, c=11.62 Å). This means that the $CuInS_2$ nanocrystal film can be easily converted to a predominantly selenide material by annealing the film in a selenium-rich atmosphere. Therefore, $CuInS_2$ is a promising alternative precursor for producing $CuInSe_2$ or $CuIn(S,Se)_2$ absorber layers.

The theoretical optimum band gap for absorber materials is in the region of 1.2-1.4 eV. By incorporating gallium into $CuIn(S,Se)_2$ thin films, the band gap can be manipulated such that, following selenization, a $Cu_xIn_yGa_zS_aSe_b$ absorber layer is formed with an optimal band gap for solar absorption.

Conventionally, costly vapor phase or evaporation techniques (for example metalorganic chemical vapor deposition (MO-CVD), radio frequency (RF) sputtering, and flash evaporation) have been used to deposit the CIGS films on a substrate. While these techniques deliver high quality films, they are difficult and expensive to scale to larger-area deposition and higher process throughput. Thus, solution processing of CIGS materials has been explored. One such approach involves depositing CIGS nanoparticles, which can be thermally processed to form a crystalline CIGS layer.

One of the major advantages of using CIGS nanoparticles is that they can be dispersed in a medium to form an ink that can be printed on a substrate in a similar way to inks in a newspaper-like process. The nanoparticle ink or paste can be deposited using low-cost printing techniques such as spin coating, slit coating and doctor blading. Printable solar cells could replace the standard conventional vacuum-deposited methods of solar cell manufacture because the printing processes, especially when implemented in a roll-to-roll processing framework, enables a much higher throughput.

The synthetic methods of the prior art offer limited control over the particle morphology, and particle solubility is usually poor which makes ink formulation difficult.

The challenge is to produce nanoparticles that overall are small, have low melting point, narrow size distribution and incorporate a volatile capping agent, so that they can be dispersed in a medium and the capping agent can be eliminated easily during the film baking process. Another challenge is to avoid the inclusion of impurities, either from synthetic precursors or organic ligands that could compromise the overall efficiency of the final device.

U.S. Pat. No. 8,784,701 [Preparation of Nanoparticle Material, published 4 Jun. 2009] and commonly-owned U.S. patent application Ser. No. 61/772,372 [Nanoparticle Precursor for Thin-Film Solar Cells, filed 4 Mar. 2013] describe the synthesis of colloidal CIGS nanoparticles having a monodisperse size distribution, capped with organic ligands that enable solution processibility and that can be removed at relatively low temperatures during thermal processing.

One of the challenges associated with the nanoparticle-based CIGS deposition approach is to achieve a high "crack-free limit" (CFL). The high organic content of colloidal CIGS nanoparticle-based ink formulations leads to large volume reduction when the as-deposited films are thermally processed. This reduction in volume can lead to cracking, peeling and delamination of the film. The critical thickness to which a film can be coated without this happening is known as the CFL. For colloidal CIGS nanoparticles, the CFL is typically about 100-150 nm, therefore ten or more coatings may be required to form a sufficiently thick film for a PV device.

Approaches to increase the CFL of colloidal nanoparticle films for optoelectronic device applications have been investigated. One such strategy is to reduce the organic content of the ink formulation, which can be achieved by synthesising nanoparticles with short-chain ligands or replacing the ligands with shorter chain functionalities, for example using a ligand exchange process. For example, Wills et al. reported the exchange of oleate ligands with shorter chain octyldithiocarbamate ligands on the surface of PbSe/CdSe core/shell nanoparticles to prepare more densely packed nanoparticle films. [A. W. Wills, M. S. Kang, A. Khare, W. L. Gladfelter and D. J. Norris, *ACS Nano*, 2010, 4, 4523] However, ligand exchange adds an extra processing step to the nanoparticle synthesis, and complete exchange can be difficult to achieve. Using the alternative approach of passivating the nanoparticle surface with short-chain ligands during colloidal synthesis requires changes to the reaction chemistry, and can lead to aggregation of the nanoparticles, rendering them poorly soluble.

In the ceramics industry, it is known that organic additives such as binders can be incorporated into a precursor solution to increase its CFL. However, this is unfavorable for CIGS nanoparticle films, since the organic additives may decompose to leave carbon residues within the film that can be detrimental to device performance. For example, Oda et al. reported a reduction in cracking of $CuGaSe_2$ films produced via an electro-deposition process with the addition of gelatin to the precursor solution, however the post-annealing carbon concentration was found to increase with increasing gelatin concentration. [Y. Oda, T. Minemoto and H. Takakura, *J. Electrochem. Soc.*, 2008, 155, H292] Further, in the preparation of solution processed CIGS films, additives such as binders typically decompose at particle surfaces, which can impede grain growth. [T. Todorov and D. B. Mitzi, *Eur. J. Inorg. Chem.*, 2010, 1, 17] An additional method used in the ceramics industry is to increase the drying time to prevent rapid film shrinkage, however this also increases the processing time.

Thus, there is a need for a method that increases the CFL of CIGS nanoparticle films, without substantially increasing the processing time or introducing components into the film that would be detrimental to device performance and/or impede grain growth.

BRIEF SUMMARY OF THE INVENTION

A method is described to formulate a CIGS nanoparticle-based ink, which can be processed to form a thin film with a crack-free limit (CFL) of 500 nm or greater. Herein, the term "CIGS" should be understood to refer to any material of the general formula $Cu_wIn_xGa_{1-x}Se_yS_{2-y}$, where $0.1 \leq w \leq 2$; $0 \leq x \leq 1$ and $0 \leq y \leq 2$, including doped species thereof. The method enables a CIGS layer with a thickness of 1 μm or greater to be deposited in just two coating steps, while maintaining a high quality, crack-free film. Further processing can be employed to form a photovoltaic device.

The method comprises: dissolving or dispersing Cu(In, Ga)$S_2$ and Cu(In,Ga)$Se_2$ nanoparticles; mixing the nanoparticle solutions/dispersions and adding oleic acid (2-5 wt. %) to form an ink; depositing the ink on a substrate; annealing to remove the organic components of the ink formulation, forming a film with a CFL ≥500 nm; repeating the deposition and annealing process to form a CIGS film ≥1 μm; and incorporating the film into a PV device.

BRIEF DESCRIPTION OF THE SEVERAL VIEWS OF THE DRAWING(S)

DETAILED DESCRIPTION OF THE INVENTION

Herein, a method is disclosed for preparing a CIGS nanoparticle ink that can be deposited on a substrate and annealed to form a film with a thickness of 500 nm or greater, without cracking, peeling or delamination. By repeating the deposition and annealing processes, a film of 1 μm or greater can be deposited in two coating steps, with good adhesion between the two layers and to the underlying substrate, to form a homogeneous film. Further processing can be employed to fabricate a PV device. The high CFL enables a high-quality CIGS absorber layer to be formed in just two coating steps, reducing the labor intensity and processing time with respect to prior art nanoparticle-based deposition methods to form CIGS thin films. Using the current method, a crack-free limit of 500 nm or greater can be achieved without the addition of a binder to the ink formulation. The use of binders may be undesirable as they can decompose at the nanoparticle surface, impeding grain growth. A high film quality is desirable to optimize the performance characteristics of the PV device, such as the open-circuit voltage ($V_{OC}$), the short-circuit current ($J_{SC}$), the fill-factor (FF) and the overall power conversion efficiency (PCE).

The ink formulation comprises a combination of organic-capped Cu(In,Ga)$Se_2$ and Cu(In,Ga)$S_2$ nanoparticles, and oleic acid, dissolved or dispersed in solution. The organic ligands passivating the surface of the nanoparticles provide solubility, allowing the nanoparticles to be processed into an ink. The organic components of the ink formulation can be removed by thermal annealing at relatively low processing temperatures, well-within the PV device processing protocol. This enables carbon residues, which can be detrimental to device performance, to be removed from the film prior to sintering.

A selenization process can be employed to partially or completely convert the Cu(In,Ga)$S_2$ nanoparticles to Cu(In, Ga)$Se_2$, to form either a Cu(In,Ga)(S,Se)$_2$ or Cu(In,Ga)$Se_2$ absorber layer. A selenization process may also be desirable in order to grow large grains, which are desirable since the recombination of charge carriers is promoted at grain boundaries. Thus a grain size on the order of the absorber layer thickness is desirable to maximize the PCE of the photovoltaic device.

The inherent chemical composition of the nanoparticles, i.e., the Cu:In:Ga ratios, can be can be manipulated during synthesis to tune the band gap of the CIGS absorber layer. Description of One Particular Preparative Procedure According to the Invention.

Figure 1:
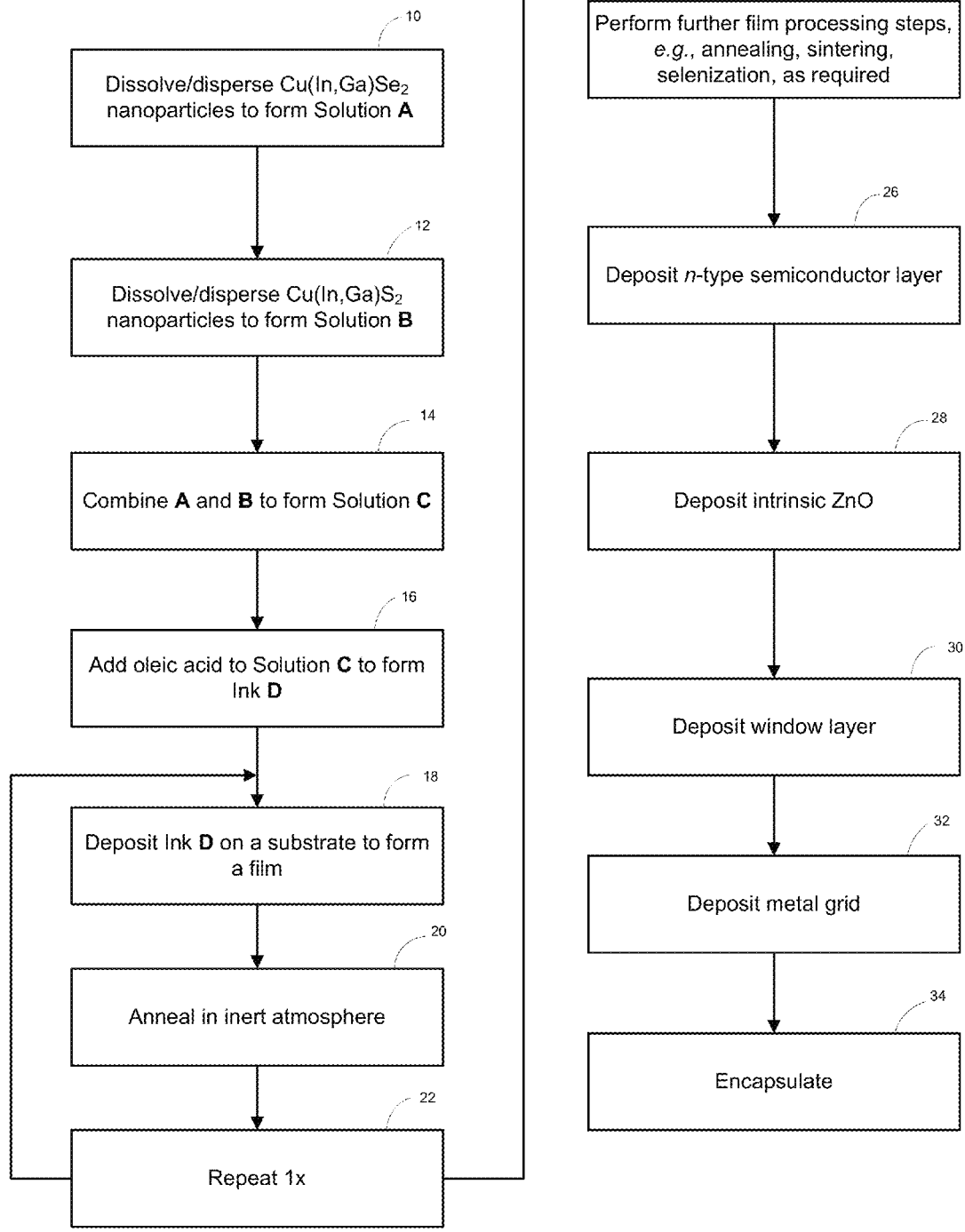
FIG. 1 is a flow diagram summarizing the preparative procedure for forming a CIGS film with a CFL of 500 nm or greater and subsequently fabricating a PV device comprising that film.

According to certain embodiments, a CIGS device may be prepared as follows:
1. Dissolve/disperse Cu(In,Ga)$Se_2$ nanoparticles in a first solvent, to form a solution, A (box 10 in FIG. 1)
2. Dissolve/disperse Cu(In,Ga)$S_2$ nanoparticles in a second solvent, to form a solution, B (box 12 in FIG. 1)
3. Combine A and B in a suitable ratio to form a solution, C (box 14 in FIG. 1)
4. Add oleic acid to solution C and mix to form an ink, D (box 16 in FIG. 1)
5. Deposit the ink, D, on a substrate to form a film (box 18 in FIG. 1)

6. Anneal in an inert atmosphere (box 20 in FIG. 1)
7. Repeat steps 5 and 6 (box 22 in FIG. 1)
8. Perform further film processing steps, e.g. annealing, sintering, selenization, as required (box 24 in FIG. 1)
9. Deposit an n-type semiconductor layer to form a junction (box 26 in FIG. 1)
10. Deposit intrinsic ZnO to form an extended depletion layer (box 28 in FIG. 1)
11. Deposit a window layer (box 30 in FIG. 1)
12. Deposit a metal grid (box 32 in FIG. 1) and,
13. Encapsulate the device (box 34 in FIG. 1).

The preparation of solution-processable $Cu(In,Ga)(S,Se)_2$ nanoparticles is described in U.S. Pat. No. 8,784,701 and commonly-owned and U.S. patent application Ser. No. 61/772,372, the contents of which are hereby incorporated by reference in their entireties. In particular embodiments, the $Cu(In,Ga)Se_2$ nanoparticles are capped with an organoselenol ligand and the $Cu(In,Ga)S_2$ nanoparticles are capped with an organothiol ligand. The nanoparticles need not be stoichiometric, and may include doped species.

The first and second solvents may be the same or different, but are typically miscible. The first and second solvents must be capable of dissolving or dispersing the nanoparticles. Those skilled in the art will realize that the choice of solvent depends on the surface coating of the nanoparticles, such as the chemical nature of the capping ligands, if present. Preferably the first and second solvents are organic solvents. A specific example is toluene, but other solvents known to those skilled in the art may be used, including, but not restricted to, alkanes (e.g. hexane), chlorinated solvents e.g. (dichloromethane, chloroform, etc.), ketones (e.g. isophorone), ethers (e.g. anisole), terpenes (e.g. α-terpinene, limonene, etc.), etc.

Solutions A and B are combined in a suitable ratio to form solution C. In certain embodiments, the ratio lies in the range 0.8:1-1:0.8, for example 1:1.

Optionally, further additives may be incorporated into the ink formulation, for example rheology modifiers and/or adhesion promoters. By way of example, additives may be used to alter dispersion stability, ink viscosity, surface wettability, solvent evaporation rate, and the like. Such additives may be designed so as to be eliminated from the film during a heating step. Other additives may be incorporated which could remain in the film in order to achieve particular device properties—e.g., antimony salts to promote grain growth, and/or other salts to passivate grain boundaries.

In certain embodiments, oleic acid is added at a concentration between 2-5 wt. % of the total ink formulation. Other such long-chain, mono-unsaturated fatty acids may also be suitable. To formulate the ink, D, solution C and the oleic acid can be mixed by any suitable method including, but not restricted to, shaking, stirring, and/or ultrasonication.

The nanoparticle ink, D, may be deposited on any suitable substrate. Examples include, but are not restricted to, indium tin oxide (ITO), molybdenum-coated bare glass, and molybdenum-coated soda-lime glass (SLG).

Any suitable method may be used to deposit the ink, D, onto the substrate. Examples include, but are not restricted to, spin coating, slit coating, doctor blading and inkjet printing.

In particular embodiments, steps 5 and 6 yield a film with a thickness greater than or equal to 500 nm (post-annealing). The steps are repeated to achieve a film thickness greater than or equal to 1 μm. Most preferably, the film thickness lies in the range 1.0-2.0 μm.

One skilled in the art will realize that the annealing temperature and time following the deposition of each CIGS layer will depend on the nature of the solvent and organic components of the ink formulation. In certain embodiments, the films are annealed at a first, lower temperature in the region of 250-300° C., for example about 270° C., for between 2-7 minutes, for example about 5 minutes, then the films are subsequently annealed at a second, higher temperature in the region of 400-430° C., for example about 415° C., for between 2-7 minutes, for example about 5 minutes.

The film processing steps optionally comprise a selenization process, during which the CIGS film is annealed in a selenium-rich atmosphere. Any suitable selenium source may be used to provide the selenium-rich atmosphere, such as a solid or liquid selenium compound that can be vaporized, or a gaseous selenium source. In one particular embodiment, the selenium-rich atmosphere is provided by $H_2Se$ gas at a concentration of ≤10 vol. %, more preferably 2-5 vol. %, in an inert carrier gas such as, but not restricted to, $N_2$.

Any suitable n-type semiconductor layer can be deposited. Examples include, but are not restricted to, CdS and ZnS.

In certain embodiments, the window layer consists of aluminum zinc oxide (AZO), but other transparent conducting oxides known to those skilled in the art, such as indium tin oxide (ITO), may be used.

EXAMPLES

Example 1: GIGS Thin Film Fabricated from a $CuInSe_2$—$CuInS_2$-Oleic Acid (2 wt. %) Ink $CuInSe_2$ nanoparticles capped with 1-octane selenol were dissolved in toluene to form a 500 mg/mL solution, E. $CuInS_2$ nanoparticles capped with 1-octane thiol were dissolved in toluene to form a 500 mg/mL solution, F. E and F were combined in a 1:1 ratio to form a solution, G. Oleic acid (2 wt. %) was added to the solution G and shaken to form an ink, H.

A layer of $CuInSe_2$ was deposited on Mo-coated SLG substrates by spin coating at a concentration of 100 mg/mL, using a spin speed of 2,000 rpm. The layer was annealed at 270° C. for 5 minutes and 415° C. for 5 minutes to remove the ligand, yielding a layer thickness of approximately 50 nm.

The ink, H, was deposited on top of the $CuInSe_2$ layer by spin coating at a concentration of 500 mg/mL, using a spin speed of 2000 rpm. The film was annealed at 270° C. for 2 minutes, then 415° C. for 2 minutes to remove the organic components of the ink formulation. The process was repeated.

The films were annealed under a selenium-rich atmosphere, using 2.14 vol. % $H_2Se$ in $N_2$, at 520° C. for 60 minutes.

Figure 2:
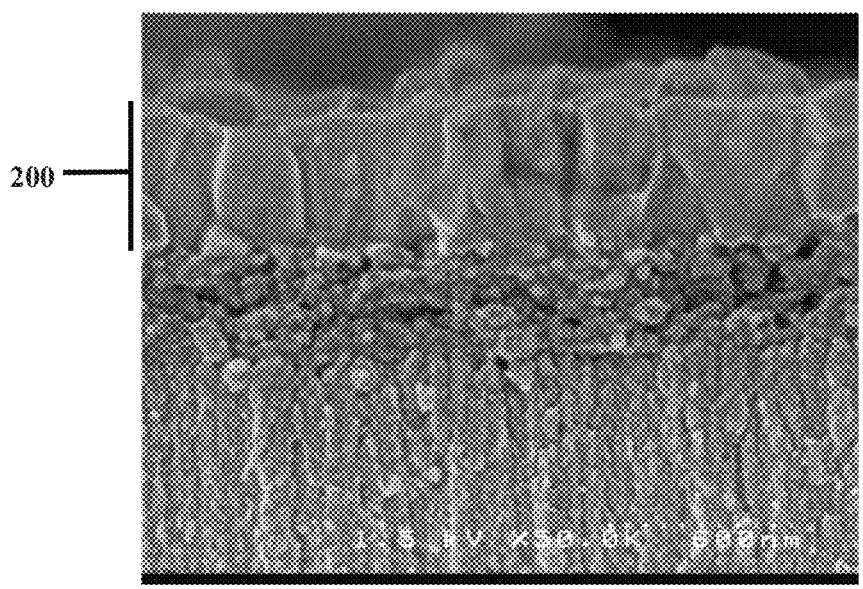
FIG. 2 is a scanning electron microscopy (SEM) image of the CIGS film formed in Example 1, showing a crystalline CIGS layer (at 200).

Optical microscopy revealed a smooth film with a shiny, crack-free surface, indicating a high film quality. Scanning electron microscopy (SEM) showed a crystalline $CuIn(S,Se)_2$ layer (200 in FIG. 2) with grain sizes on the order of 480 nm. X-ray diffraction (XRD) of the film confirmed the presence of a single crystallographic phase.

Example 2: CIGS Thin Film Fabricated from a $CuInSe_2$—$CuInS_2$-Oleic Acid (5 wt. %) Ink $CuInSe_2$ nanoparticles capped with 1-octane selenol were dissolved in toluene to form a 500 mg/mL solution, I. $CuInS_2$ nanoparticles capped with 1-octane thiol were dissolved in toluene to form a 500 mg/mL solution, J. I and J were combined in a 1:1 ratio to form a solution, K. Oleic acid (5 wt. %) was added to the solution K and shaken to form an ink, L.

The ink, L, was deposited on top of Mo-coated SLG by spin coating at a concentration of 500 mg/mL, using a spin speed of 2000 rpm. The film was annealed at 415° C. for 2 minutes to remove the organic components of the ink formulation, forming a 560 nm film. The process was repeated, yielding a total film thickness of 1120 nm.

In optical microscopy images, the film appeared smooth and crack-free after deposition and annealing of the first and second 560 nm CIGS layers, confirming a crack-free limit greater than 500 nm.

The foregoing presents particular embodiments of a system embodying the principles of the invention. Those skilled in the art will be able to devise alternatives and variations which, even if not explicitly disclosed herein, embody those principles and are thus within the invention's spirit and scope. Although particular embodiments of the present invention have been shown and described, they are not intended to limit what this patent covers. One skilled in the art will understand that various changes and modifications may be made without departing from the scope of the present invention as literally and equivalently covered by the following claims.

What is claimed is:

1. A method for forming a photovoltaic film on a substrate comprising:
    dissolving only $CuInSe_2$ nanoparticles in a first solvent to form a first solution;
    dissolving only $CuInS_2$ nanoparticles in a second solvent to form a second solution;
    combining only the first solution and the second solution to form a third solution;
    adding only oleic acid to the third solution to form a binder-free ink;
    depositing the ink on the substrate to form a first film;
    annealing the first film in an inert atmosphere;
    depositing additional ink on the first film on the substrate to form a second film; and
    annealing the second film in an inert atmosphere,
    wherein, the first and second films are further annealed under a selenium-rich atmosphere comprising $H_2Se$ gas in an inert carrier gas, the $H_2Se$ gas being at a concentration of 2 to 10% by volume, and
    wherein after annealing each of the first film and the second film are crack-free films that comprise a crystalline $CuIn(S,Se)_2$ layer with grain sizes on the order of 480 nm.

2. The method recited in claim 1 further comprising sintering at least one of the first and the second films.

3. The method recited in claim 1 wherein the $CuInSe_2$ and $CuInS_2$ nanoparticles are capped with an organic ligand.

4. The method recited in claim 3 wherein the $CuInSe_2$ nanoparticles are capped with an organoselenol ligand.

5. The method recited in claim 3 wherein the $CuInS_2$ nanoparticles are capped with an organothiol ligand.

6. The method recited in claim 1 wherein at least one of the first solvent and the second solvent is toluene.

7. The method recited in claim 1 wherein the first solvent and the second solvent are selected from the group consisting of: alkanes; chlorinated solvents; ketones; ethers; and, terpenes.

8. The method recited in claim 1 wherein the ratio of the first solution and the second solution in the third solution is between about 0.8:1 and about 1:0.8.

9. The method recited in claim 1 wherein the oleic acid concentration in the ink is between about 2 and about 5 percent by weight.

10. The method recited in claim 1 wherein the substrate is indium tin oxide-coated glass.

11. The method recited in claim 1 wherein the substrate is molybdenum-coated glass.

12. The method recited in claim 1 wherein the substrate is molybdenum-coated soda-lime glass.

13. The method recited in claim 1 wherein one or both of the first and second annealing steps comprises annealing at a first, lower temperature between about 250° C. and about 300° C. for about 0.2 to about 7 minutes followed by annealing at a second, higher temperature between about 400° C. and about 460° C. for about 0.2 to about 7 minutes.

14. The method as recited in claim 1 wherein the inert carrier gas is molecular nitrogen.

15. The method as recited in claim 1 wherein the concentration of the $H_2Se$ gas is between about 2 and about 5 percent by volume.

16. A photovoltaic film on a substrate prepared by the process comprising the steps of:
    dissolving only $CuInSe_2$ nanoparticles in a first solvent to form a first solution;
    dissolving only $CuInS_2$ nanoparticles in a second solvent to form a second solution;
    combining only the first solution and the second solution to form a third solution;
    adding only oleic acid to the third solution to form a binder-free ink;
    depositing the ink on the substrate to form a first film;
    annealing the first film in an inert atmosphere;
    depositing additional ink on the first film on the substrate to form a second film; and,
    annealing the second film in an inert atmosphere,
    wherein, the first and second films are further annealed under a selenium-rich atmosphere comprising $H_2Se$ gas in an inert carrier gas, the $H_2Se$ gas being at a concentration of 2 to 10% by volume, to produce a crystalline $CuIn(S,Se)_2$ layer with grain sizes on the order of 480 nm and
    wherein after annealing each of the first film and the second film are crack-free films.

17. A photovoltaic device prepared by the process comprising the steps of:
    dissolving only $CuInSe_2$ nanoparticles in a first solvent to form a first solution;
    dissolving only $CuInS_2$ nanoparticles in a second solvent to form a second solution;
    combining only the first solution and the second solution to form a third solution;
    adding only oleic acid to the third solution to form a binder-free ink;
    depositing the ink on a substrate to form a first film;
    annealing the first film in an inert atmosphere;
    depositing additional ink on the first film on the substrate to form a second film;
    annealing the second film in an inert atmosphere;
    depositing an n-type semiconductor layer on the second film;
    depositing intrinsic ZnO on the n-type semiconductor layer;
    depositing a window layer on the intrinsic ZnO;
    depositing a metal grid on the window layer to form a multi-layer assembly; and, encapsulating the multi-layer assembly, wherein, the first and second films are further annealed under a selenium-rich atmosphere comprising $H_2Se$ gas in an inert carrier gas, the $H_2Se$ gas being at a concentration of 2 to 10% by volume, to produce a crystalline $CuIn(S,Se)_2$ layer with grain sizes on the order of 480 nm and wherein after annealing each of the first film and the second film are crack-free films.

18. A photovoltaic device as recited in claim 17 wherein the n-type semiconductor layer comprises cadmium sulfide (CdS).

19. A photovoltaic device as recited in claim 17 wherein the n-type semiconductor layer comprises zinc sulfide (ZnS).

20. A photovoltaic device as recited in claim 17 wherein the window layer comprises aluminum zinc oxide.

21. A photovoltaic device as recited in claim 17 wherein the window layer comprises indium tin oxide.

* * * * *